(12) United States Patent
Kim (10) Patent No.: US 10,804,909 B1
(45) Date of Patent: Oct. 13, 2020

(54) LOCKING DETECTING CIRCUIT AND OPERATING METHOD THEREOF

(71) Applicant: SK hynix Inc., Icheon (KR)

(72) Inventor: Tae-Pyeong Kim, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/783,999

(22) Filed: Feb. 6, 2020

(30) Foreign Application Priority Data

Jul. 5, 2019 (KR) .................. 10-2019-0081284

(51) Int. Cl.
*H03L 7/06* (2006.01)
*H03L 7/095* (2006.01)
*H03L 7/191* (2006.01)

(52) U.S. Cl.
CPC .............. *H03L 7/095* (2013.01); *H03L 7/191* (2013.01)

(58) Field of Classification Search
CPC combination set(s) only.
See application file for complete search history.

(56) References Cited

U.S. PATENT DOCUMENTS

| | | | |
|---|---|---|---|
| 6,670,834 B1 * | 12/2003 | Swanson | H03L 7/095 327/156 |
| 7,443,247 B2 * | 10/2008 | Camuffo | H03L 7/0891 331/1 A |
| 9,157,957 B1 | 10/2015 | Tzeng et al. | |

FOREIGN PATENT DOCUMENTS

| KR | 20090005148 A | 1/2009 |
|---|---|---|
| KR | 101710450 B1 | 2/2017 |

* cited by examiner

*Primary Examiner* — An T Luu (57) ABSTRACT

A locking detecting circuit of a Phase Locked Loop (PLL) circuit includes an output signal counter performing an output signal counting operation of counting an output signal of the PLL circuit during a counting time period, a period determiner performing a period changing operation of decreasing the counting time period until a difference between a current period counting value and a preceding period counting value becomes smaller than a threshold value, and a locking detector detecting a locking of the PLL circuit when the difference between the current period counting value and the preceding period counting value becomes smaller than the threshold value.

20 Claims, 9 Drawing Sheets

ABSTRACT# LOCKING DETECTING CIRCUIT AND OPERATING METHOD THEREOF

CROSS-REFERENCE TO RELATED APPLICATIONS

The present application claims priority of Korean Patent Application No. 10-2019-0081284, filed on Jul. 5, 2019, which is incorporated herein by reference in its entirety.

BACKGROUND

1. Field

Embodiments of the present disclosure relate to a locking detecting circuit, and more particularly, to a locking detecting circuit for quickly detecting a locking of a Phase Locked Loop (PLL) circuit and a method of operating the locking detecting circuit.

2. Description of the Related Art

The computer environment paradigm has shifted to ubiquitous computing, which enables computing systems to be used anytime and everywhere. As a result, use of portable electronic devices such as mobile phones, digital cameras, and laptop computers has rapidly increased. These portable electronic devices each use a memory system having one or more memory devices for storing data. A memory system may be used as a main memory system or an auxiliary memory system of a portable electronic device.

Since memory systems have no mechanical driving parts, they provide advantages such as excellent stability and durability, high information access speed, and low power consumption as compared with a hard disk device. Examples of the memory systems having such advantages include universal serial bus (USB) memory devices, memory cards having various interfaces, solid state drives (SSD), and so on.

SUMMARY

Embodiments of the present disclosure are directed to a locking detecting circuit that may detect a locking of a Phase Locked Loop (PLL) circuit by changing a counting time period for counting an output signal of the PLL circuit.

In accordance with an embodiment of the present invention, a locking detecting circuit of a Phase Locked Loop (PLL) circuit, the locking detecting circuit includes: an output signal counter suitable for performing an output signal counting operation of counting an output signal of the PLL circuit during a counting time period; a period determiner suitable for performing a period changing operation of decreasing the counting time period until a difference between a current period counting value and a preceding period counting value becomes smaller than a threshold value, the preceding period counting value being obtained by counting the output signal of the PLL circuit during a preceding time period, the current period counting value being obtained by counting the output signal of the PLL circuit during a current time period following the preceding time period, the preceding time period and the current time period corresponding to the counting time period; and a locking detector suitable for detecting a locking of the PLL circuit when the difference between the current period counting value and the preceding period counting value becomes smaller than the threshold value.

Preferably, the locking detecting circuit further includes: a repetition controller suitable for controlling the period determiner in order to repeat the output signal counting operation and the period changing operation until the difference between the current period counting value and the preceding period counting value becomes smaller than a threshold value.

In accordance with another embodiment of the present invention, a method of operating a locking detecting circuit for detecting a locking of a Phase Locked Loop (PLL) circuit, the method includes: decreasing a counting time period based on a difference between a current period counting value and a preceding period counting value, the preceding period counting value being obtained by counting an output signal of the PLL circuit during a preceding time period, the current period counting value being obtained by counting the output signal of the PLL circuit during a current time period following the preceding time period; repeatedly perform the counting of the output signal of the PLL circuit and the decreasing of the counting time period until the difference between the current period counting value and the preceding period counting value becomes smaller than a threshold value; and detecting the locking of the PLL circuit when the difference between the current period counting value and the preceding period counting value becomes smaller than the threshold value.

In accordance with yet another embodiment of the present invention, a method of operating a locking detecting circuit for detecting a locking of a Phase Locked Loop (PLL) circuit, the method includes: sequentially counting an output signal of the PLL circuit during a counting time period; decreasing the counting time period based on a difference between a current period counting value and a preceding period counting value, the preceding period counting value being obtained by counting the output signal of the PLL circuit during a preceding time period, the current period counting value being obtained by counting the output signal of the PLL circuit during a current time period following the preceding time period, the preceding time period and the current time period corresponding to the counting time period; repeatedly performing the sequentially counting the output signal of the PLL circuit and the decreasing of the counting time period until the difference between the current period counting value and the preceding period counting value becomes smaller than a first threshold value; increasing the counting time period when the difference between the current period counting value and the preceding period counting value becomes smaller than the first threshold value; repeatedly performing the sequentially counting the output signal of the PLL circuit and the increasing of the counting time period until the difference between the current period counting value and the preceding period counting value becomes smaller than a second threshold value; and detecting the locking of the PLL circuit when the difference between the current period counting value and the preceding period counting value becomes smaller than the second threshold value.

DETAILED DESCRIPTION

Exemplary embodiments of the present disclosure will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1A:
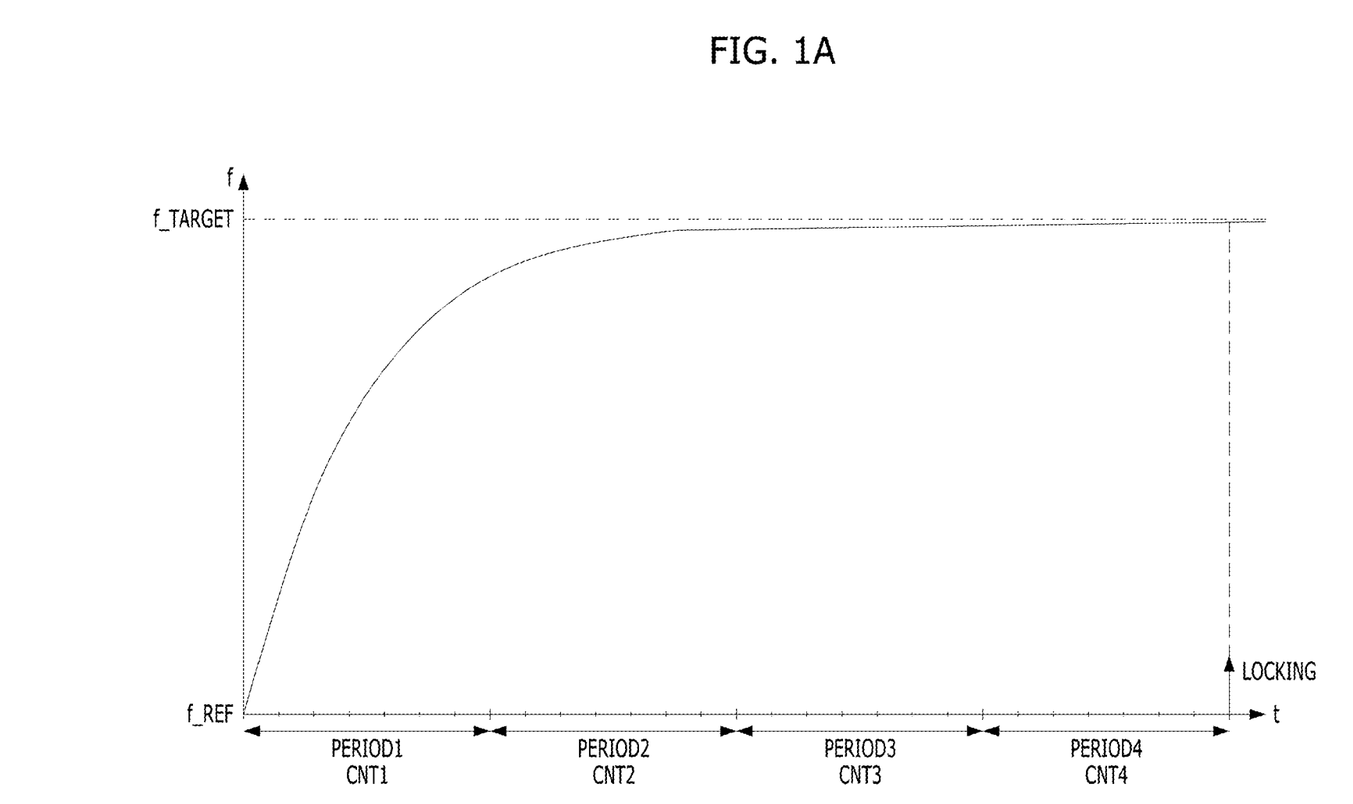
FIGS. 1A and 1B illustrate a method of detecting a locking of a Phase Locked Loop (PLL) circuit according to prior art.
Figure 1B:
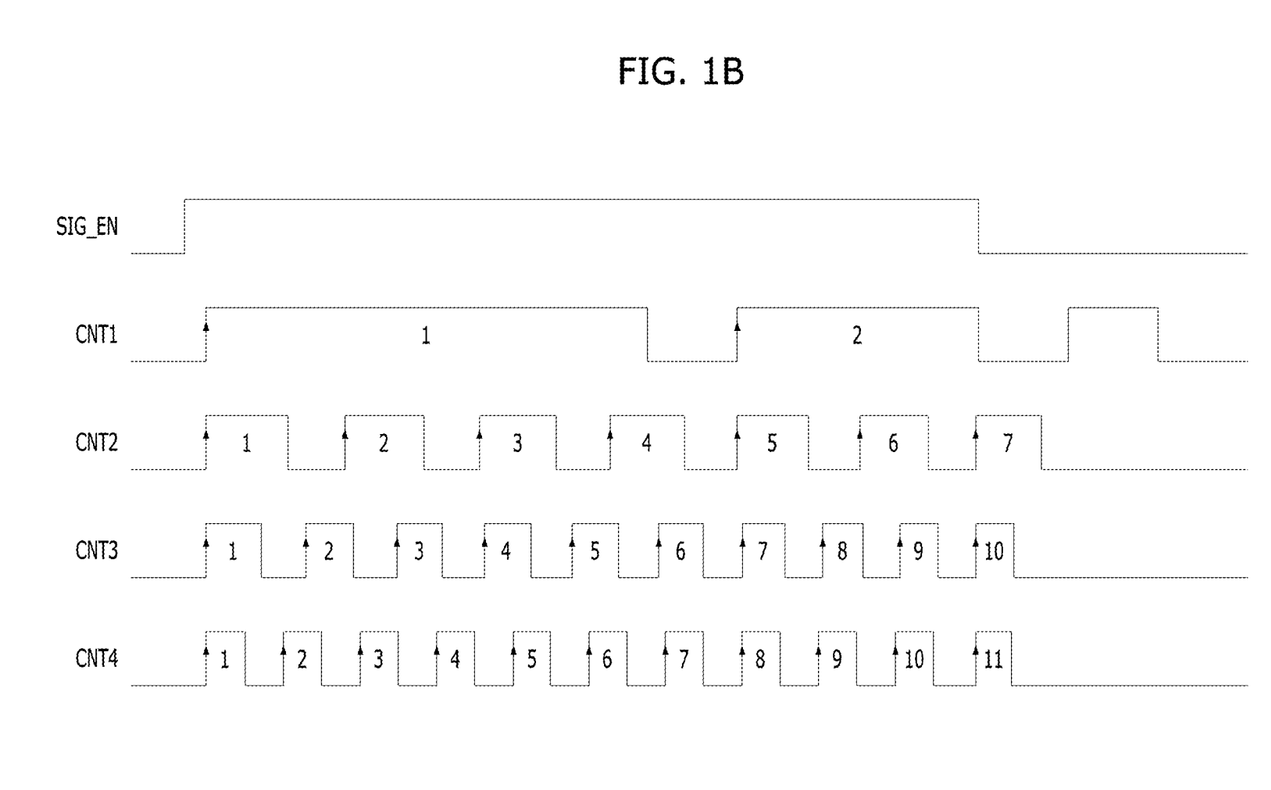

FIGS. 1A and 1B illustrate a method of detecting a locking of a Phase Locked Loop (PLL) circuit according to prior art.

A graph shown in FIG. 1A shows a frequency of an output signal of the PLL circuit which varies over time.

The PLL circuit may form a closed circuit loop, and may receive a low frequency signal outputted from an oscillator such as a crystal oscillator and output a high frequency signal. The locking detecting circuit may lock the PLL circuit when the PLL circuit stably outputs the output signal having a target frequency f_TARGET. When the PLL circuit is locked, the output signal having the target frequency f_TARGET may be provided to integrated circuits connected to the PLL circuit, and the integrated circuits may be driven according to the output signal. The locking of the PLL circuit may be performed while a memory system is booted, and therefore a time required for the locking may be directly connected to a booting time of the memory system.

Referring to FIG. 1A, an initial value of the frequency of the output signal of the PLL circuit may be the same as a reference frequency f_REF, which is a frequency of a reference signal provided by the oscillator, and the frequency of the output signal may gradually increase as time passes until it reaches the target frequency f_TARGET.

Figure 2:
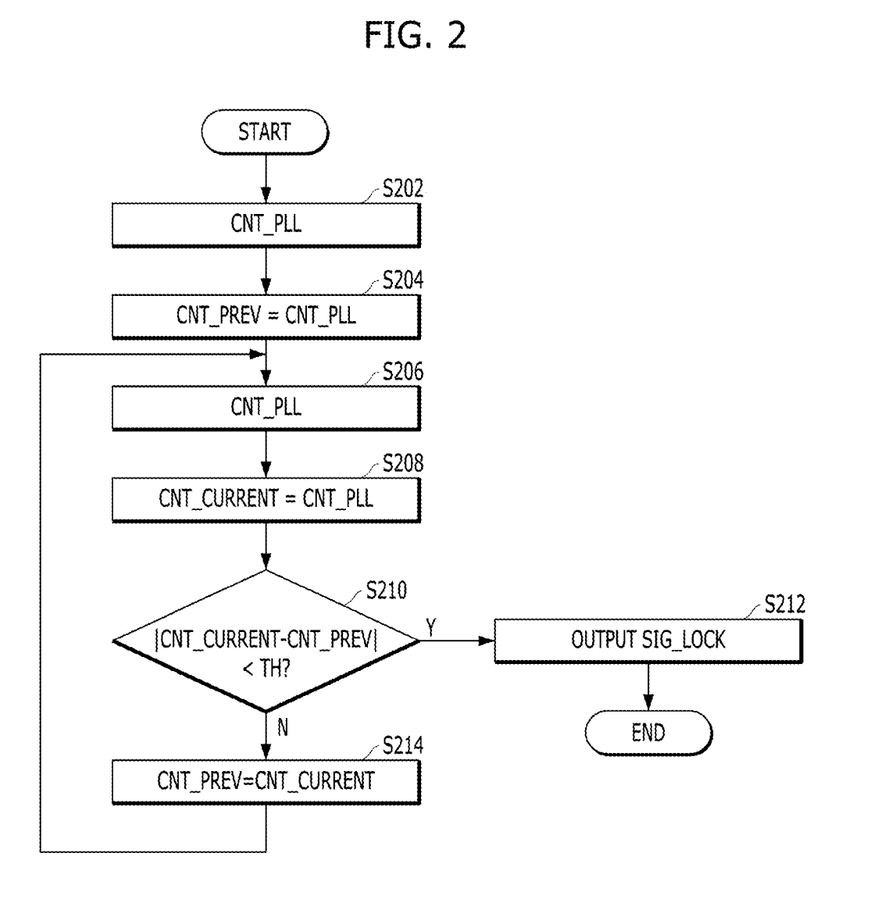
FIG. 2 is a flowchart describing a process of detecting the locking of the PLL circuit according to the prior art.

A conventional locking detecting circuit may repeatedly count the output signal of the PLL circuit for every fixed counting time period. When a difference between a counting value of the output signal for a current time period and a counting value of the output signal for a preceding time period followed by the current time period becomes smaller than a predetermined threshold value, the conventional locking detecting circuit may detect the locking of the PLL circuit FIG. 2 is a flowchart describing a process of detecting the locking of the PLL circuit according to the prior art.

At S202, a locking detecting circuit may count the output signal of the PLL circuit during an initial time period corresponding to the fixed counting time period. The locking detecting circuit may increment a counting value CNT_PLL whenever a rising edge of the output signal occurs during the initial time period, which will be described later with reference to FIG. 1B.

At S204, the locking detecting circuit may set the counting value CNT_PLL that is measured at S202 as a preceding period counting value CNT_PREV. The steps S202 and S204 may be an initialization operation.

At S206, the locking detecting circuit may count the output signal of the PLL circuit for a subsequent time period following a preceding time period, e.g., the initial time period. According to the prior art, the size of the subsequent time period may be the same as the size of the preceding time period. As described earlier with reference to FIG. 1A, when the frequency of the output signal increases over time, the frequency of the output signal measured during the subsequent time period may be higher than the frequency of the output signal measured during the preceding time period. Therefore, the counting value CNT_PLL measured at S206 may be larger than the counting value CNT_PLL measured at S202.

At S208, the locking detecting circuit may set the counting value CNT_PLL measured at S206 as a current period counting value CNT_CURRENT.

At S210, the locking detecting circuit may compare a difference between the current period counting value CNT_CURRENT and the preceding period counting value CNT_PREV with a predetermined threshold value TH. When the difference between the current period counting value CNT_CURRENT and the preceding period counting value CNT_PREV is equal to or larger than the predetermined threshold value TH, the frequency of the output signal may rapidly change. On the other hand, when the difference between the current period counting value CNT_CURRENT and the preceding period counting value CNT_PREV is smaller than the predetermined threshold value TH, the output signal having a frequency of a predetermined size may be outputted.

At S212, when the difference between the current period counting value CNT_CURRENT and the preceding period counting value CNT_PREV is smaller than the predetermined threshold value TH ('Y' at S210), the locking detecting circuit may output a locking signal SIG_LOCK. The PLL circuit may output the output signal having a locked frequency in response to the locking signal SIG_LOCK, and integrated circuits coupled to the PLL circuit may be driven according to the output signal having the locked frequency.

At S214, when the difference between the current period counting value CNT_CURRENT and the preceding period counting value CNT_PREV is equal to or greater than the predetermined threshold value TH ('N' at S210), the locking detecting circuit may set the counting value measured at S206 as the preceding period counting value CNT_PREV and may repeatedly perform the operations of S206 to S210 until the difference between the current period counting value CNT_CURRENT and the preceding period counting value CNT_PREV becomes smaller than the predetermined threshold value TH.

Referring back to FIG. 1A, first to fourth time periods PERIOD 1 to PERIOD 4 may have the same size. The locking detecting circuit may count the output signal of the PLL circuit during the first time period PERIOD1. The locking detecting circuit may perform an initialization operation for storing a first counting value CNT1, which is a counting value measured during the first time period PERIOD1, as the preceding period counting value CNT_PREV. The locking detecting circuit may count the output signal of the PLL circuit during the second time period PERIOD2 following the first time period PERIOD1, and may store a second counting value CNT2, which is a counting value measured during the second time period PERIOD2, as the current period counting value CNT_CURRENT.

When a difference between the current period counting value CNT_CURRENT, i.e., the second counting value CNT2, and the preceding period counting value CNT_PREV, i.e., the first counting value CNT1, is equal to or greater than the predetermined threshold value TH, the locking detecting circuit may store the second counting value CNT2 as the preceding counting value CNT_PREV, and may count the output signal of the PLL circuit during the third time period PERIOD3. The locking detecting circuit may store the third counting value CNT3, which is a counting value measured during the third time period PERIOD3, as the current period counting value CNT_CURRENT. The locking detecting circuit may compare a difference between the current period counting value CNT_CURRENT, i.e., the third counting value CNT3, and the preceding period counting value CNT_PREV, i.e., the second counting value CNT2, with the predetermined threshold value TH. The locking detecting circuit may repeatedly perform the above-described counting and comparing operations until the difference between the current period counting value CNT_CURRENT and the preceding period counting value CNT_PREV becomes smaller than the predetermined threshold value TH. When a difference between the fourth counting value CNT4, which is a counting value measured during the fourth time period PERIOD4, and the third counting value CNT3 is smaller than the predetermined threshold value TH, the locking detecting circuit may be able to detect the locking of the PLL circuit at a moment when the fourth time period PERIOD4 is over.

FIG. 1B is a timing diagram showing the first to fourth counting values CNT1 to CNT4 for the output signal of the PLL circuit. Each of the first to fourth counting values CNT1 to CNT4 is measured for a fixed time period.

The locking detecting circuit may output an enable signal SIG_EN having a value of '1' during the fixed time period, and the fixed time period may have the same size as each of the first to fourth time periods PERIOD1 to PERIOD4 shown in FIG. 1A. The locking detecting circuit may count the output signal of the PLL circuit during the fixed time period. To be specific, the locking detecting circuit may increment the counting value at a rising edge of the output signal.

For example, as shown in FIG. 1A, the frequency of the output signal of the PLL circuit during the first time period PERIOD1 may be a low frequency, and the frequency of the output signal may increase as time passes. As illustrated in FIG. 1B, since the rising edge of the output signal occurs twice during the first time period PERIOD1, the locking detecting circuit may store the first counting value CNT1 as a value of '2.' As shown in FIG. 1A, since the frequency of the output signal increases sharply at the beginning, the number of the rising edges of the output signal occurring during the second time period PERIOD2 may also increase sharply. The increasing speed of the frequency of the output signal may decrease after the second time period PERIOD2, and thus the difference between the current period counting value CNT_CURRENT and the preceding period counting value CNT_PREV may also decrease. When it is assumed that the difference between the fourth counting value CNT4 having a value of '11' and the third counting value CNT3 having a value of '10' is smaller than the predetermined threshold value TH, the locking detecting circuit may be able to detect the locking of the PLL circuit.

According to the prior art, although the increasing speed of the frequency of the output signal of the PLL circuit gradually decreases as time passes, the locking detecting circuit may count the output signal of the PLL circuit for the fixed time period, and detect whether the PLL circuit is locked or not based on the difference between the current period counting value CNT_CURRENT and the preceding period counting value CNT_PREV. Referring to FIG. 1A, the frequency of the output signal converges to the target frequency f_TARGET during the third time period PERIOD3, and the difference between the third counting value CNT3 and the second counting value CNT2 is equal to or greater than the predetermined threshold value TH. Therefore, the locking detecting circuit may be able to detect the locking of the PLL circuit only after the fourth time period PERIOD4 is over. Therefore, according to the prior art, since the locking of the PLL circuit is not quickly detected, a locking detecting time may be delayed and thus the booting time of the memory system may be also delayed as described above.

According to an embodiment of the present disclosure, a locking detecting circuit may count the output signal of the PLL circuit during a time period that is adjustable. To be specific, the locking detecting circuit may decrease the time period based on a difference between a current period counting value CNT_CURRENT and a preceding period counting value CNT_PREV. The locking detecting circuit may repeatedly perform an operation of counting the output signal of the PLL circuit while decreasing the time period. When the difference between the current period counting value CNT_CURRENT and the preceding period counting value CNT_PREV becomes smaller than a first threshold value TH1, the locking of the PLL circuit may be detected more quickly.

According to another embodiment of the present disclosure, the locking detecting circuit may repeatedly perform the operation of counting the output signal of the PLL circuit while increasing the time period after the difference between the current period counting value CNT_CURRENT and the preceding period counting value CNT_PREV becomes smaller than the first threshold value TH1. The locking detecting circuit may detect the locking of the PLL circuit more precisely by detecting the locking of the PLL circuit when the difference between the current period counting value CNT_CURRENT and the preceding period counting value CNT_PREV becomes smaller than a second threshold value TH2.

The embodiments of the present disclosure will be described in detail with reference to FIGS. 3 to 7.

Figure 3:
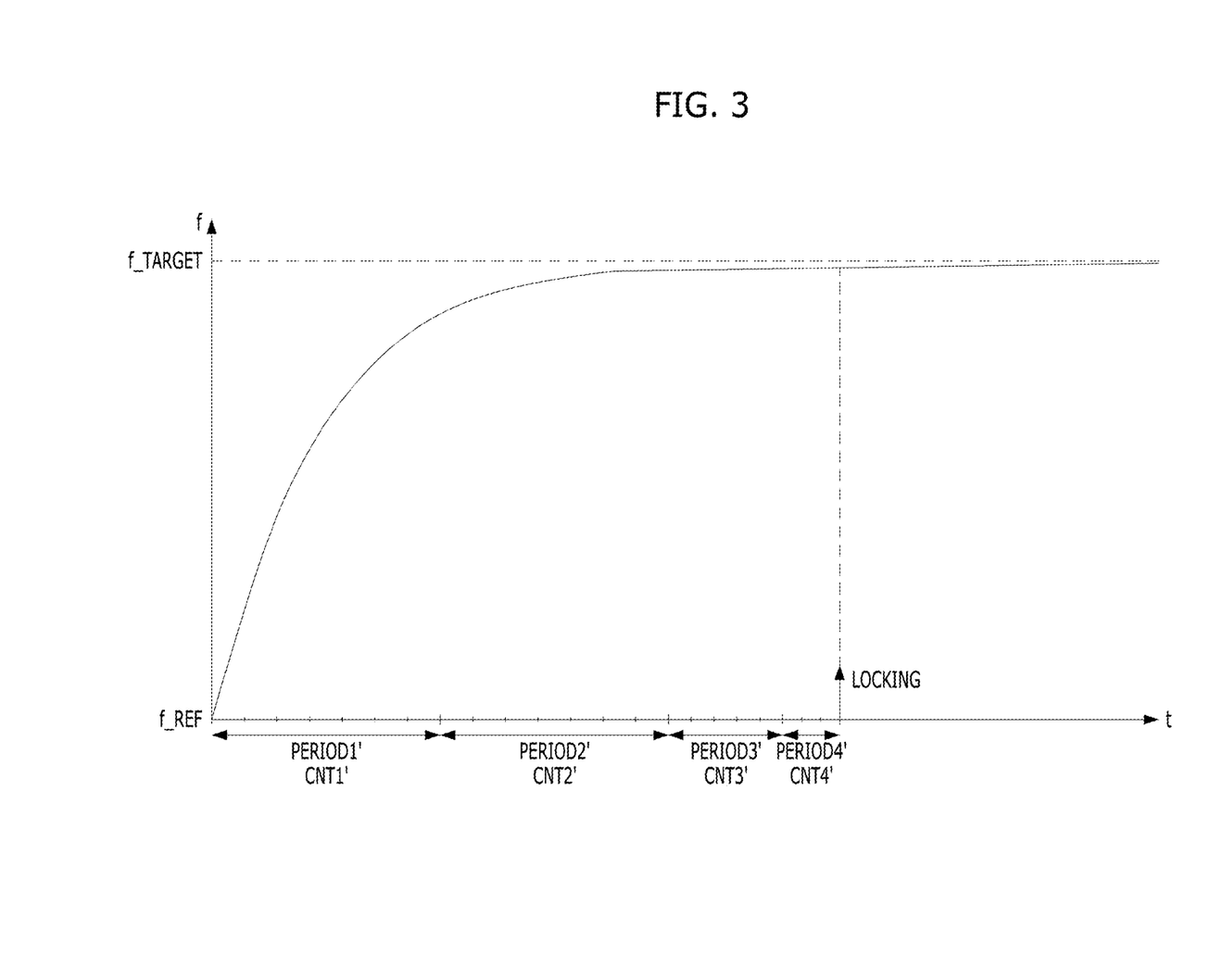
FIG. 3 is a graph illustrating a method of detecting a locking of a PLL circuit in accordance with an embodiment of the present disclosure.

FIG. 3 is a graph illustrating a method of detecting a locking of a PLL circuit in accordance with an embodiment of the present disclosure.

According to the embodiment of the present disclosure, a locking detecting circuit may decrease a time period based on a difference between a current period counting value CNT_CURRENT and a preceding period counting value CNT_PREV. For example, when the difference between the current period counting value CNT_CURRENT and the preceding period counting value CNT_PREV is equal to or greater than a first threshold value TH1, the locking detecting circuit may decrease a subsequent time period to be a half of a time period during which the current period counting value CNT_CURRENT was measured.

Referring to FIG. 3, the locking detecting circuit may count an output signal of the PLL circuit during a first time period PERIOD1'. The locking detecting circuit may set a first counting value CNT1' measured during the first time period PERIOD1' as the preceding period counting value CNT_PREV and count the output signal during a second time period PERIOD2'. The locking detecting circuit may set a second counting value CNT2' measured during the second time period PERIOD2' as the current period counting value CNT_CURRENT and compare a difference between the current period counting value CNT_CURRENT and the preceding period counting value CNT_PREV with the first threshold value TH1. When the difference between the current period counting value CNT_CURRENT and the preceding period counting value CNT_PREV is equal to or greater than the first threshold value TH1, the locking detecting circuit may decrease a third time period PERIOD3' to be a half of the second time period PERIOD2'. Also, the locking detecting circuit may set the second counting value CNT2' as the preceding period counting value CNT_PREV.

The locking detecting circuit may count the output signal during the third time period PERIOD3'. After that, the locking detecting circuit may normalize a third counting value CNT3' measured during the third time period PERIOD3' based on a size ratio of the second time period PERIOD2' to the third time period PERIOD3'. For example, when the size of the third time period PERIOD3' is the half of the second time period PERIOD2', the locking detecting circuit may normalize the third counting value CNT3' by doubling the third counting value CNT3'. After the third time period PERIOD3' is over, when the difference between the current period counting value CNT_CURRENT and the preceding period counting value CNT_PREV is still equal to or greater than the first threshold value TH1, the locking detecting circuit may be able to decrease a fourth time period PERIOD4', which is a subsequent time period following the third time period PERIOD3', to be a half of the third time period PERIOD3'. At this time, the locking detecting circuit may set the third counting value CNT3' as the preceding period counting value CNT_PREV.

The locking detecting circuit may count the output signal during the fourth time period PERIOD4'. The locking detecting circuit may normalize a fourth counting value CNT4' measured during the fourth time period PERIOD4' based on a size ratio of the third time period PERIOD3' to the fourth time period PERIOD4'. The locking detecting circuit may set a normalized value of the fourth counting value CNT4' as the current period counting value CNT_CURRENT. The locking detecting circuit may detect the locking of the PLL circuit when the difference between the current period counting value CNT_CURRENT and the preceding period counting value CNT_PREV becomes smaller than the first threshold value TH1. According to the embodiment of the present disclosure, the locking detecting circuit may be able to detect the locking of the PLL circuit more quickly by detecting whether the PLL circuit is locked or not by decreasing the time period for measuring the counting value of the output signal as time passes.

Figure 4:
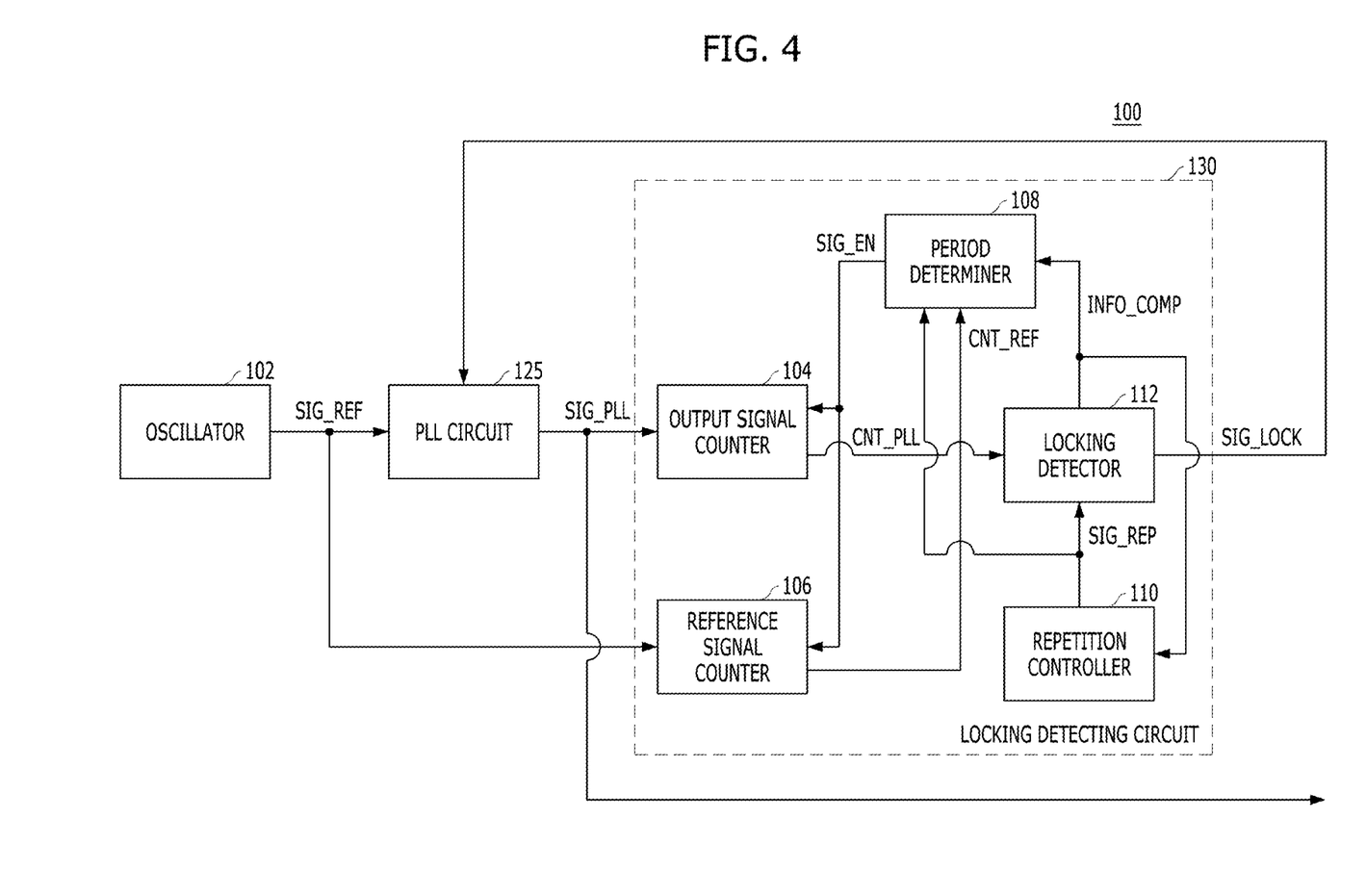
FIG. 4 illustrates an integrated circuit including a locking detecting circuit in accordance with an embodiment of the present disclosure.

FIG. 4 illustrates an integrated circuit 100 including a locking detecting circuit 130 in accordance with an embodiment of the present disclosure.

The integrated circuit 100 may include an oscillator 102, a PLL circuit 125, and the locking detecting circuit 130. The locking detecting circuit 130 may include an output signal counter 104, a reference signal counter 106, a period determiner 108, a repetition controller 110, and a locking detector 112.

The oscillator 102 may generate and output a reference signal SIG_REF. For example, the oscillator 102 may be a low frequency oscillator realized with crystal. The oscillator 102 may provide the reference signal SIG_REF to the PLL circuit 125 and the reference signal counter 106.

The PLL circuit 125 may generate an output signal SIG_PLL having a target frequency based on the reference signal SIG_REF. The PLL circuit 125 may form a closed circuit loop and generate the output signal SIG_PLL having the target frequency that is higher than a frequency of the reference signal SIG_REF. The PLL circuit 125 may provide the output signal counter 104 with the output signal SIG_PLL.

The reference signal counter 106 may count the reference signal SIG_REF. The reference signal counter 106 may increment its counting value whenever a rising edge of the reference signal SIG_REF occurs. The period determiner 108 may provide the reference signal counter 106 with an enable signal SIG_EN, and thus the reference signal counter 106 may count the reference signal SIG_REF while the enable signal SIG_EN has an enabled value, e.g., a value of '1'. The reference signal counter 106 may provide the period determiner 108 with a reference signal counting value CNT_REF obtained by counting the reference signal SIG_REF.

The output signal counter 104 may count the output signal SIG_PLL. The output signal counter 104 may increment a counting value CNT_PLL whenever a rising edge of the output signal SIG_PLL occurs. The period determiner 108 may provide the output signal counter 104 with the enable signal SIG_EN, and thus the output signal counter 104 may count the output signal SIG_PLL while the enable signal SIG_EN has the enabled value of '1.' The output signal counter 104 may provide the locking detector 112 with the counting value CNT_PLL.

The locking detector 112 may be able to detect whether the PLL circuit 125 is locked or not based on the counting value CNT_PLL. To be specific, the locking detector 112 may compare a difference between a current period counting value CNT_CURRENT and a preceding period counting value CNT_PREV with a first threshold value TH1. The locking detector 112 may compare the difference between the current period counting value CNT_CURRENT and the preceding period counting value CNT_PREV with the first threshold value TH1 after normalizing a counting value measured during a current period based on a size ratio of a preceding period to a current period. The preceding period counting value CNT_PREV is measured during the preceding period, and the current period counting value CNT_CURRENT is a normalized value of the counting value measured during the current period following the preceding period.

For example, when the current period is a half of the preceding period, the locking detector 112 may determine the current period counting value CNT_CURRENT by doubling the counting value measured during the current period. When the difference between the current period counting value CNT_CURRENT and the preceding period counting value CNT_PREV is equal to or greater than the first threshold value TH1, the locking detector 112 may provide comparison information INFO_COMP to the period determiner 108 and the repetition controller 110.

According to the embodiment of the present disclosure, when the difference between the current period counting value CNT_CURRENT and the preceding period counting value CNT_PREV is smaller than the first threshold value TH1, the locking detector 112 may output a locking signal SIG_LOCK to detect the locking of the PLL circuit 125. In response to the locking signal SIG_LOCK, the PLL circuit 125 may output the output signal SIG_PLL that is locked to drive integrated circuits coupled to the PLL circuit 125.

The period determiner 108 may decrease a time period in which the output signal SIG_PLL of the PLL circuit 125 is counted in response to the comparison information INFO_COMP. For example, the period determiner 108 may decrease the time period by half as described above with reference to FIG. 3. To be specific, the period determiner 108 may change the time period by changing an enabled period of the enable signal SIG_EN based on the reference signal counting value CNT_REF.

The period determiner 108 may simultaneously provide the enable signal SIG_EN to the output signal counter 104 and the reference signal counter 106. The period determiner 108 may change the enable signal SIG_EN to a disabled value, e.g., a value of '0' when the reference signal counting value CNT_REF, which is measured from a point of time when the enable signal SIG_EN is changed to the enabled value of '1,' reaches a counting period value. As the enable signal SIG_EN is changed to the disabled value of '0,' the output signal counter 104 and the reference signal counter 106 may reset the counting value CNT_PLL and the reference signal counting value CNT_REF to '0.'

Therefore, the time period for counting the output signal SIG_PLL of the PLL circuit 125 and the reference signal SIG_REF is determined by the counting period value.

The period determiner 108 may decrease the counting period value based on the comparison information INFO_COMP. For example, the period determiner 108 may decrease the counting period value by half and change the enable signal SIG_EN to the enabled value of '1.' In response to the enable signal SIG_EN to the enabled value of '1,' the output signal counter 104 and the reference signal counter 106 count the output signal SIG_PLL and the reference signal SIG_REF and output the counting value CNT_PLL and the reference signal counting value CNT_REF.

After that, when the reference signal counting value CNT_REF measured from the point of time when the enable signal SIG_EN is changed to the enabled value of '1' reaches the changed counting period value, the period determiner 108 may change the enable signal SIG_EN into the disabled value of '0' again to stop counting the output signal SIG_PLL and the reference signal SIG_REF. As described above, as the counting period value is decreased by half, the time period for counting the output signal SIG_PLL of the PLL circuit 125 is also decreased by half in response to the enable signal SIG_EN.

After that, the period determiner 108 may decrease the counting period value again based on the comparison information INFO_COMP and decrease the time period for counting the output signal SIG_PLL of the PLL circuit 125 by changing the enable signal SIG_EN based on the reference signal counting value CNT_REF that reaches the changed counting period value, as described above. In this manner, the period determiner 108 may adjust the time period for counting the output signal SIG_PLL according to the comparison information INFO_COMP.

Figure 5A:
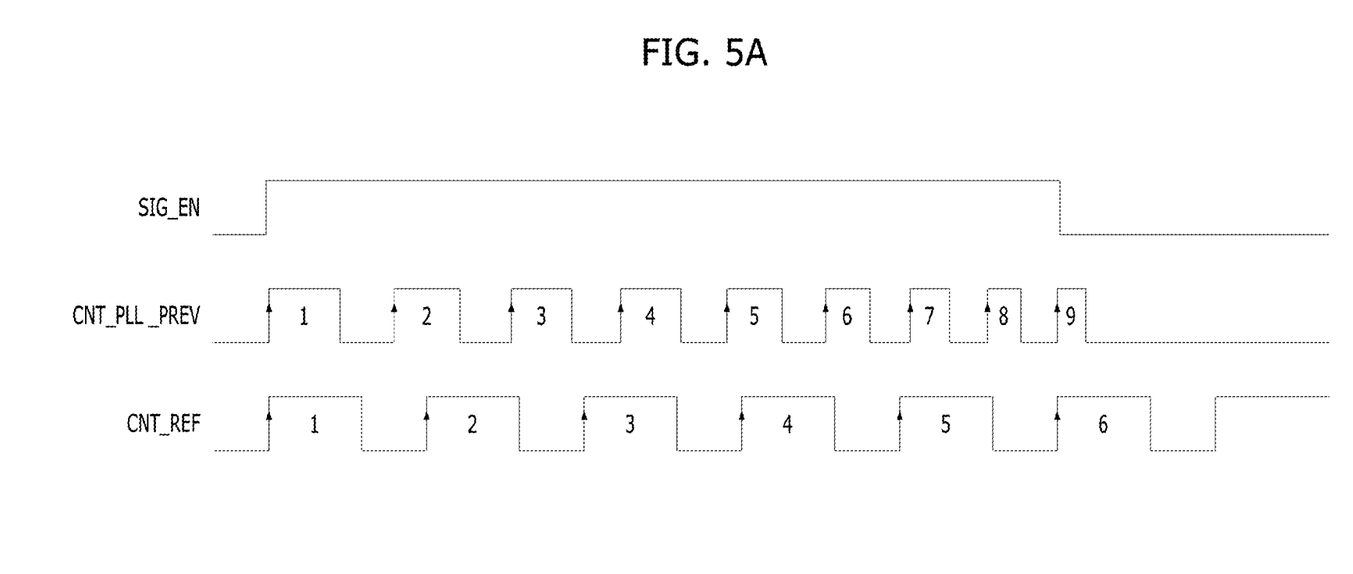
FIGS. 5A and 5B are waveform diagrams illustrating a method of counting an output signal by changing a time period.
Figure 5B:
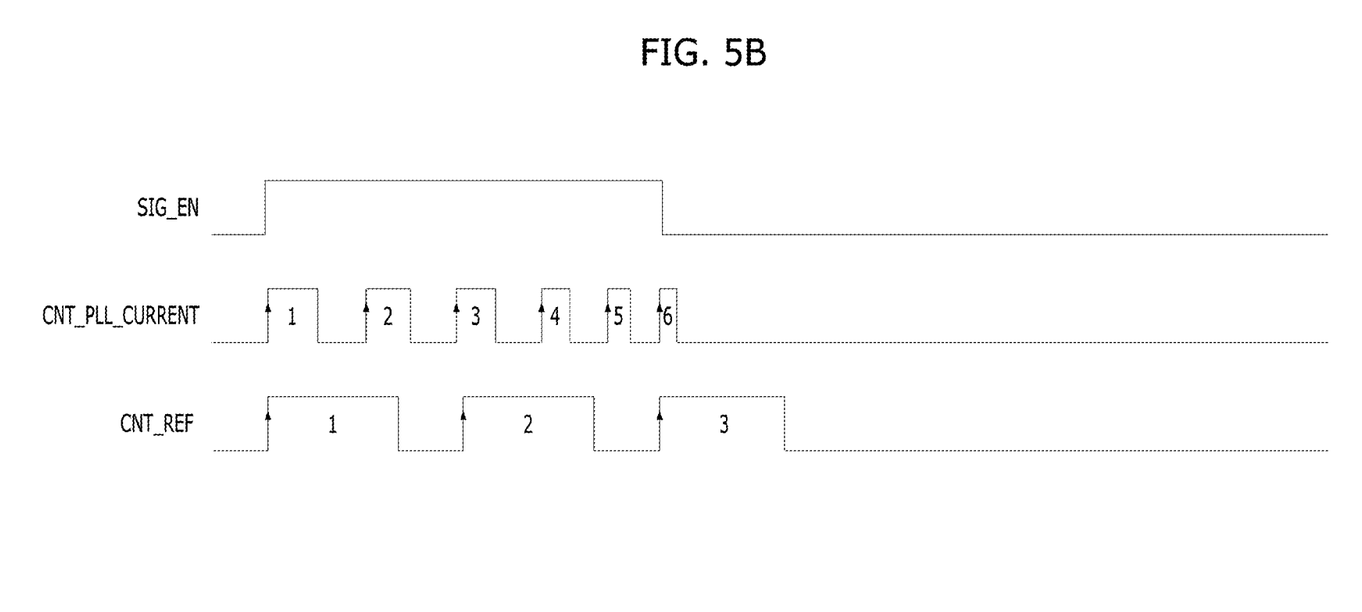

FIGS. 5A and 5B are waveform diagrams illustrating a method of counting an output signal by changing a time period. The method illustrated in FIGS. 5A and 5B will be described with reference to FIG. 4.

FIG. 5A shows the reference signal counting value CNT_REF, the enable signal SIG_EN, and a counting value CNT_PREV of the output signal SIG_PLL of the PLL circuit 125 in the preceding period. The period determiner 108 may provide the enable signal SIG_EN to the reference signal counter 106 and the output signal counter 104. When the enable signal SIG_EN has the enabled value of '1,' the reference signal counter 106 and the output signal counter 104 may count the reference signal SIG_REF and the output signal SIG_PLL.

The reference signal counter 106 may provide the period determiner 108 with the reference signal counting value CNT_REF. When the reference signal counting value CNT_REF reaches a counting period value determined based on the comparison information INFO_COMP, the period determiner 108 may change the enable signal SIG_EN to the disabled value '0.' For example, as shown in FIG. 5A, the period determiner 108 may change the enable signal SIG_EN to the disabled value '0' when the reference counting value CNT_REF reaches '6' that is the counting period value. The output signal counter 104 may provide the locking detector 112 with the preceding period counting value CNT_PREV of the output signal SIG_PLL measured while the enable signal SIG_EN has the enabled value of '1' in the preceding period.

FIG. 5B shows the reference counting value CNT_REF, the enable signal SIG_EN, and a counting value CNT_CURRENT of the output signal SIG_PLL in the current period. For the sake of convenience in description, it is assumed that the current period is a half of the preceding period. A counting period value determined based on the comparison information INFO_COMP in the current period may be decreased to be a half of the previous counting period value that is described in FIG. 5A. Referring to FIG. 5B, the period determiner 108 may change the enable signal SIG_EN to the disabled value '0' when the reference signal counting value CNT_REF reaches '3,' which is a half of '6'. The output signal counter 104 may provide the locking detector 112 with the current period counting value CNT_CURRENT that is measured while the enable signal SIG_EN has the enabled value of '1' in the current period.

Referring back to FIG. 4, the repetition controller 110 may control the period determiner 108 and the locking detector 112 to repeatedly perform the operation of detecting whether the PLL circuit 125 is locked or not by comparing the difference between the current period counting value CNT_CURRENT and the preceding period counting value CNT_PREV with the first threshold value TH1 and of decreasing the subsequent counting time period. For this purpose, the repetition controller 110 may generate a repetition signal SIG_REP based on the comparison information INFO_COMP and output the repetition signal SIG_REP to the period determiner 108 and the locking detector 112.

When it is detected that the PLL circuit 125 is locked based on the comparison information INFO_COMP, the repetition controller 110 may control the period determiner 108 and the locking detector 112 to stop the above operations and output the locking signal SIG_LOCK.

Figure 6:
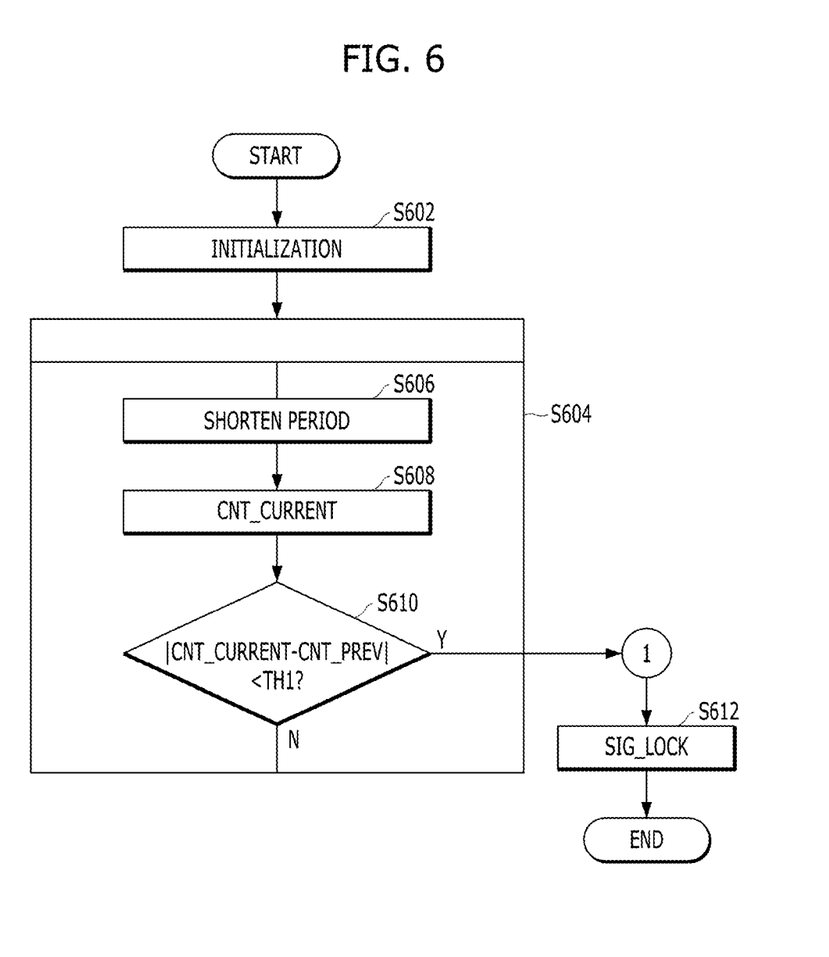
FIG. 6 is a flowchart describing a process of operating a locking detecting circuit in accordance with an embodiment of the present disclosure.

FIG. 6 is a flowchart describing a method of operating the locking detecting circuit 130 shown in FIG. 4 in accordance with an embodiment of the present disclosure. The method described in FIG. 6 will be described with reference to FIG. 4.

At S602, the locking detecting circuit 130 may perform an initialization operation. To be specific, the period determiner 108 may control the output signal counter 104 to count the output signal SIG_PLL of the PLL circuit 205 during an initial time period. The locking detector 112 may set the counting value CNT_PLL that is measured during the initial time period as the preceding period counting value CNT_PREV. The period determiner 108 may then control the output signal counter 104 to count the output signal SIG_

PLL of the PLL circuit 205 during a current time period having the same value as the initial time period. The locking detector 112 may set the counting value CNT_PLL that is measured during the current time period as the current period counting value CNT_CURRENT. When the difference between the current period counting value CNT_CURRENT and the preceding period counting value CNT_PREV is equal to or greater than the first threshold value TH1, the locking detector 112 may perform an operation of S604. Although not illustrated in FIG. 6, when the difference between the current period counting value CNT_CURRENT and the preceding period counting value CNT_PREV becomes smaller than the first threshold value TH1 in the initialization operation, the locking detector 112 may terminate the locking detection operation and output the locking signal SIG_LOCK to the PLL circuit 205.

When the difference between the current period counting value CNT_CURRENT and the preceding period counting value CNT_PREV is determined to be equal to or greater than the first threshold value TH1 in the initialization operation, at S606, the period determiner 108 may determine a current time period PERIOD for counting the output signal SIG_PLL of the PLL circuit 205 to be a half of a previous current time period, e.g., the current time period used in the initialization operation. When the period determiner 108 may determine the current time period PERIOD to be a half of the previous current time period, the locking detector 112 may set the previous current time period as the preceding time period and thus set the current period counting value CNT_CURRENT measured during the previous current time period as the preceding period counting value CNT_PREV.

At S608, the period determiner 108 may control the output signal counter 104 to count the output signal SIG_PLL of the PLL circuit 125 during the current time period PERIOD that has been determined at S606. When a new counting value is measured during the current time period PERIOD, the locking detector 112 may normalize the new counting value. To be specific, the locking detector 112 may normalize the new counting value that is measured during the current time period PERIOD based on a size ratio of the current time period PERIOD to the preceding time period. For example, as described above, when the current time period PERIOD is the half of the preceding time period, the locking detector 112 may normalize the new counting value measured during the current time period PERIOD to be doubled. The locking detector 112 may set the normalized counting value as the current period counting value CNT_CURRENT.

According to the embodiment of the present disclosure, the locking detector 112 may normalize the new counting value measured during the current time period PERIOD to correspond to a counting value measured during the same time period as the preceding time period. That is, in order to compare the new counting value with the preceding counting value CNT_PREV, the locking detector 112 may compensate for a time difference between the current time period PERIOD and the preceding time period through the normalization.

At S610, the locking detector 112 may compare a difference between the current period counting value CNT_CURRENT and the preceding period counting value CNT_PREV with a first threshold TH1.

At S612, the locking detector 112 may output the locking signal SIG_LOCK when the difference between the current period counting value CNT_CURRENT and the preceding period counting value CNT_PREV becomes smaller than the first threshold value TH1 ('Y' at S610). The locking detector 112 may provide the PLL circuit 125 with the locking signal SIG_LOCK to lock the PLL circuit 125.

At S604, the locking detecting circuit 130 may repeatedly perform the operations of S606 to S610 until it detects the locking of the PLL circuit 125. To be specific, when the difference between the current period counting value CNT_CURRENT and the preceding period counting value CNT_PREV is equal to or greater than the first threshold value TH1 ('N' at S610), the repetition controller 110 may be able to control the period determiner 108 and the locking detector 112 to repeatedly perform the operations of S606 to S610.

Figure 7:
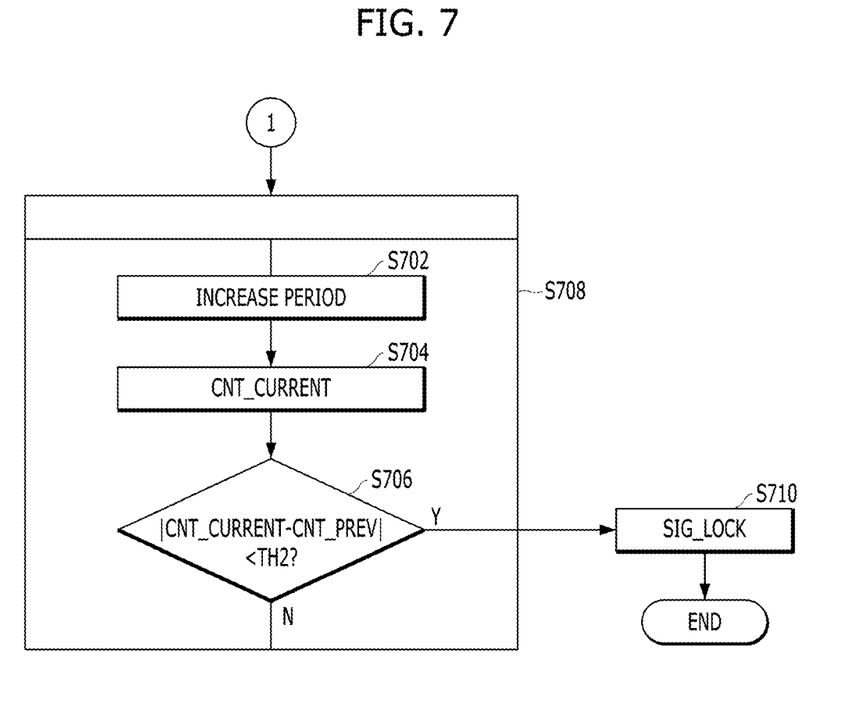
FIG. 7 is a flowchart describing a process of operating a locking detecting circuit in accordance with another embodiment of the present disclosure.

FIG. 7 is a flowchart describing a method of operating the locking detecting circuit 130 shown in FIG. 4 in accordance with another embodiment of the present disclosure. The method described in FIG. 7 will be described with reference to FIG. 4.

According to this embodiment of the present invention, even though it is determined that the difference between the current period counting value CNT_CURRENT and the preceding period counting value CNT_PREV is smaller than the first threshold value TH1, which is described above with reference to FIG. 6 ('Y' at S610), the locking detector 112 may not output the locking signal SIG_LOCK. Instead, the repetition controller 110 may be able to detect the locking of the PLL circuit 125 more precisely by controlling the period determiner 108 and the locking detector 112 to repeatedly perform a locking detection operation for the PLL circuit 125 until the difference between the current period counting value CNT_CURRENT and the preceding period counting value CNT_PREV becomes smaller than a second threshold value TH2, while increasing the current time period PERIOD for counting the output signal SIG_PLL of the PLL circuit 125.

At S702, the period determiner 108 may increase the current time period PERIOD. For example, the period determiner 108 may increase the current time period PERIOD to have a time value twice the previous current time period when it is determined that the difference between the current period counting value CNT_CURRENT and the preceding period counting value CNT_PREV is smaller than the first threshold value TH1. Similar to the method described above with reference to FIG. 4 and FIGS. 5A and 5B, but in this embodiment, the period determiner 108 may increase the current time period PERIOD and control the output signal counter 104 to count the output signal SIG_PLL of the PLL circuit 125 with the current time period PERIOD having the increased time value using the enable signal SIG_EN that has an enabled period corresponding to the time value of the current time period PERIOD.

At S704, the period determiner 108 may control the output signal counter 104 to count the output signal SIG_PLL of the PLL circuit 125 during the current time period PERIOD having the increased time value. The locking detector 112 may normalize a new counting value measured during the current time period PERIOD. To be specific, the locking detector 112 may normalize the new counting value that is measured during the current time period PERIOD based on a size ratio of the current time period PERIOD to the preceding time period followed by the current time period PERIOD. For example, when the current time period PERIOD is twice the preceding time period, the locking detector 112 may normalize the new counting value measured during the current time period PERIOD to be half. The locking detector 112 may set the normalized counting value as the current period counting value CNT_CURRENT.

At S706, the locking detector 112 may compare a difference between the current period counting value CNT_CURRENT and the preceding period counting value CNT_PREV with the second threshold value TH2. The second threshold value TH2 may be smaller than the first threshold value TH1 which is described above with reference to FIG. 6.

At S710, the locking detector 112 may output the locking signal SIG_LOCK when the difference between the current period counting value CNT_CURRENT and the preceding period counting value CNT_PREV is smaller than the second threshold value TH2 ('Y' at S706). The locking detector 112 may provide the PLL circuit 125 with the locking signal SIG_LOCK to lock the PLL circuit 125. The operation S710 may correspond to the operation S612 of FIG. 6.

At S708, the locking detecting circuit 130 may repeatedly perform the operations of S702 to S706 until it detects the locking of the PLL circuit 125. To be specific, when the difference between the current period counting value CNT_CURRENT and the preceding period counting value CNT_PREV is equal to or greater than the second threshold value TH2 ('N' at S706), the repetition controller 110 may control the period determiner 108 and the locking detector 112 to repeatedly perform the operations of S702 to S706.

According to this embodiment of the present disclosure, when the difference between the current period counting value CNT_CURRENT and the preceding period counting value CNT_PREV that are measured by decreasing the current time period PERIOD becomes smaller than the first threshold value TH1, the locking detecting circuit 130 may be able to detect the locking of the PLL circuit 125 more precisely by repeatedly performing the locking detection operation of the PLL circuit 125 until the difference between the current period counting value CNT_CURRENT and the preceding period counting value CNT_PREV becomes smaller than the second threshold value TH2 by increasing the current time period PERIOD.

According to the embodiments of the present disclosure, a locking detecting circuit may detect a locking of a PLL circuit more quickly and precisely by changing a time period for counting an output signal of the PLL circuit based on a difference between a counting value measured during a current time period and a counting value measured during a preceding time period, the preceding time period being a time period right ahead of the current time period.

While the present invention has been described with respect to the specific embodiments, it will be apparent to those skilled in the art that various changes and modifications may be made without departing from the spirit and scope of the invention as defined in the following claims.

What is claimed is:

1. A locking detecting circuit of a Phase Locked Loop (PLL) circuit, the locking detecting circuit comprising:
   an output signal counter suitable for performing an output signal counting operation of counting an output signal of the PLL circuit during a counting time period;
   a period determiner suitable for performing a period changing operation of decreasing the counting time period until a difference between a current period counting value and a preceding period counting value becomes smaller than a threshold value, the preceding period counting value being obtained by counting the output signal of the PLL circuit during a preceding time period, the current period counting value being obtained by counting the output signal of the PLL circuit during a current time period following the preceding time period, the preceding time period and the current time period corresponding to the counting time period; and
   a locking detector suitable for detecting a locking of the PLL circuit when the difference between the current period counting value and the preceding period counting value becomes smaller than the threshold value.

2. The locking detecting circuit of claim 1, wherein the locking detector normalizes a counting value of the output signal measured during the decreased counting time period.

3. The locking detecting circuit of claim 1, further comprising:
   a reference signal counter suitable for counting a reference signal in response to an enable signal so as to produce a reference signal counting value, and providing the period determiner with the reference signal counting value.

4. The locking detecting circuit of claim 3, wherein the output signal counter counts a number of rising edges of the output signal while the enable signal is enabled.

5. The locking detecting circuit of claim 4, wherein the period determiner disables the enable signal when the reference signal counting value reaches a counting period value corresponding to the counting time period.

6. The locking detecting circuit of claim 2, wherein the locking detector sets the normalized counting value as the current period counting value.

7. A method of operating a locking detecting circuit for detecting a locking of a Phase Locked Loop (PLL) circuit, the method comprising:
   decreasing a counting time period based on a difference between a current period counting value and a preceding period counting value, the preceding period counting value being obtained by counting an output signal of the PLL circuit during a preceding time period, the current period counting value being obtained by counting the output signal of the PLL circuit during a current time period following the preceding time period;
   repeatedly perform the counting of the output signal of the PLL circuit and the decreasing of the counting time period until the difference between the current period counting value and the preceding period counting value becomes smaller than a threshold value; and
   detecting the locking of the PLL circuit when the difference between the current period counting value and the preceding period counting value becomes smaller than the threshold value.

8. The method of claim 7, further comprising:
   normalizing a counting value of the output signal measured during the decreased counting time period.

9. The method of claim 7, further comprising:
   counting a reference signal in response to an enable signal so as to output a reference signal counting value.

10. The method of claim 9, wherein the counting of the output signal comprises counting a number of rising edges of the output signal that occur when the enable signal is enabled.

11. The method of claim 10, wherein the enable signal is disabled when the reference signal counting value reaches a value corresponding to the counting time period.

12. The method of claim 8, wherein in the detecting of the locking of the PLL circuit,
   the normalized counting value is set as the current period counting value.

13. The method of claim 7, further comprising:
   setting counting values obtained by sequentially counting the output signal as the preceding period counting value and the current period counting value in an initialization operation before decreasing the counting time period.

14. A method of operating a locking detecting circuit for detecting a locking of a Phase Locked Loop (PLL) circuit, the method comprising:
sequentially counting an output signal of the PLL circuit during a counting time period;
decreasing the counting time period based on a difference between a current period counting value and a preceding period counting value, the preceding period counting value being obtained by counting the output signal of the PLL circuit during a preceding time period, the current period counting value being obtained by counting the output signal of the PLL circuit during a current time period following the preceding time period, the preceding time period and the current time period corresponding to the counting time period;
repeatedly performing the sequentially counting the output signal of the PLL circuit and the decreasing of the counting time period until the difference between the current period counting value and the preceding period counting value becomes smaller than a first threshold value;
increasing the counting time period when the difference between the current period counting value and the preceding period counting value becomes smaller than the first threshold value;
repeatedly performing the sequentially counting the output signal of the PLL circuit and the increasing of the counting time period until the difference between the current period counting value and the preceding period counting value becomes smaller than a second threshold value; and
detecting the locking of the PLL circuit when the difference between the current period counting value and the preceding period counting value becomes smaller than the second threshold value.

15. The method of claim 14, wherein the second threshold value is smaller than the first threshold value.

16. The method of claim 14, further comprising normalizing a counting value of the output signal measured during the increased counting time period.

17. The method of claim 14, further comprising:
normalizing a counting value of the output signal measured during the decreased counting time period.

18. The method of claim 14, further comprising:
counting a reference signal in response to an enable signal so as to output a reference signal counting value.

19. The method of claim 18, wherein the counting of the output signal of the PLL circuit comprises counting a number of rising edges of the output signal that occur during a period in which the enable signal is enabled.

20. The method of claim 19, wherein the enable signal is disabled when the reference signal counting value reaches a value corresponding to the counting time period.

* * * * *